US 11,048,843 B1

United States Patent
Poplack et al.

(10) Patent No.: US 11,048,843 B1
(45) Date of Patent: Jun. 29, 2021

(54) DYNAMIC NETLIST MODIFICATION OF COMPACTED DATA ARRAYS IN AN EMULATION SYSTEM

(71) Applicant: CADENCE DESIGN SYSTEMS, INC., San Jose, CA (US)

(72) Inventors: Mitchell G. Poplack, San Jose, CA (US); Yuhei Hayashi, San Jose, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 378 days.

(21) Appl. No.: 16/217,434

(22) Filed: Dec. 12, 2018

(51) Int. Cl.
*G06F 30/331* (2020.01)
*G06F 30/327* (2020.01)

(52) U.S. Cl.
CPC .......... *G06F 30/331* (2020.01); *G06F 30/327* (2020.01)

(58) Field of Classification Search
CPC .............................. G06F 30/331; G06F 30/327
USPC ...................................................... 703/23–28
See application file for complete search history.

(56) References Cited

U.S. PATENT DOCUMENTS

| | | | | |
|---|---|---|---|---|
| 6,237,132 B1* | 5/2001 | Dean | ....................... | G06F 30/30 716/103 |
| 7,315,802 B1* | 1/2008 | Jenkins, IV | ............ | G06F 30/33 703/14 |
| 2007/0005323 A1* | 1/2007 | Patzer | ............ | G01R 31/318364 703/14 |
| 2014/0100841 A1* | 4/2014 | Bures | .................... | G06F 30/331 703/28 |
| 2016/0070844 A1* | 3/2016 | Shyamsukha | ......... | G06F 30/398 716/113 |

* cited by examiner

*Primary Examiner* — Juan C Ochoa
(74) *Attorney, Agent, or Firm* — Foley & Lardner LLP (57) ABSTRACT

A compaction circuit in an emulation system may store in a data array emulation data that may be read in subsequent emulation steps. For each emulation step, the compaction circuit may receive keeptags from a local control store word of the emulation step and store portions of emulation data identified by the keeptags. The keeptags in the control store words may be inserted by a compiler based upon whether a corresponding read port of emulation processor reads the stored data in the subsequent steps. The compaction circuit may also translate the logical read address of the stored data to a physical read address in the shared data array. A dynamic modification engine may enable dynamic modification of netlists while using the compacted data array. In response to a request, the dynamic modification engine may modify one or more keeptags and update read addresses in the control store words.

20 Claims, 8 Drawing Sheets

DYNAMIC NETLIST MODIFICATION OF COMPACTED DATA ARRAYS IN AN EMULATION SYSTEM

TECHNICAL FIELD

This application is generally directed towards a processor based emulation system and specifically towards systems and methods for compaction of emulation data to generate a compacted data array for a cluster of emulation processors.

BACKGROUND

Modern semiconductor based integrated circuits (ICs) are incredibly complex and contain millions of circuit devices, such as transistors, and millions of interconnections between the circuit devices. Designing such complex circuits cannot be accomplished manually, and circuit designers use computer based Electronic Design Automation (EDA) tools for synthesis, debugging, and functional verification of the ICs. A significant function of EDA tools is emulation of a user's logical system (e.g., an IC design) to perform pre-silicon functional verification, firmware and software development, and post-silicon debug. To achieve this, a typical processor-based emulation system comprises several Application Specific Integrated Circuits (ASICs), often referred to as emulation ASICs or emulation chips, all working together to execute a program generated by an emulation compiler generated from the user's IC design. The compiled program models a design under test (DUT) that is a logical representation of the user's IC design running on the several emulation ASICs of the emulation system.

An emulation chip may contain a plurality of emulation processors, which may be Boolean processors organized in various processor clusters within the emulation chip. A processor cluster may have a shared memory to access data from and write data during emulation steps. For example, in an emulation step, a plurality of read ports of an emulation processor within a processors cluster may read multiple pieces of data from the shared memory, perform an operation on the read data, and write a result of the operation through the write port of the emulation processor.

Existing memory hardware typically provides a single read port and a single write port or a single read and a single write operation in a cycle. Therefore, multiple reads and multiple writes during an emulation step requires multiple memory units with copies of the same data for corresponding multiple emulation processor input ports in a processor cluster. Furthermore, most of the data in these multiple copies may not even be read in subsequent emulation steps. Therefore, there is a large memory footprint with a large power overhead where a majority of the data maintained in the memory is not even used.

SUMMARY

What is therefore desired are systems and methods of compacting emulation data thereby enabling emulation chips with smaller memory footprint. What is further desired are systems and methods that provide a dynamic netlist modification functionality while providing emulation data compaction Embodiments disclosed herein solve the aforementioned technical problems and may provide other technical benefits as well. A compaction circuit in an emulation system may store in a shared data array with read/write access to a cluster of emulation processors emulation data that may be read in subsequent emulation steps. The compaction circuit may not store the emulation data that may not be read in the subsequent steps. For each emulation step, the compaction circuit may receive keeptag bits from a local control store word of the emulation step and store the portions of emulation data identified by the keeptag bits. The keeptag bits in the control store words may be inserted by a compiler based upon whether a corresponding read port of emulation processor in the cluster reads the stored data in the subsequent steps. The compaction circuit may also translate the logical read address of the stored data to a physical read address in the shared data array.

A dynamic modification engine may enable dynamic netlist modification using compacted data. More particularly, the dynamic modification engine may modify statically scheduled control store words to account for the discrepancy of the physical address when keeptags are dynamically modified to store more data or less data. The dynamic modification engine may iterate through all the downstream control store words incrementing read addresses by the number of keeptag bits that are dynamically asserted. Alternatively, the dynamic modification engine may iterate through all the downstream control store words decrementing read address by the number of keeptag bits that are dynamically de-asserted. The dynamic modification engine may be configured to receive multiple dynamic modification requests and use a queue to process the requests sequentially.

In an embodiment, an emulation method comprises receiving, by a dynamic modification engine in a logic emulator, a request to dynamically change a netlist associated with a logic being emulated; modifying, by the dynamic modification engine, a keeptag associated with the change in netlist in a control store word of a corresponding emulation step; and dynamically applying, by the dynamic modification engine, offsets to one or more affected read addresses of control store words based upon modifying the keeptag.

In another embodiment, a logic emulator comprises a dynamic modification circuit configured to: receive a request to dynamically change a netlist associated with a logic being emulated; modify a keeptag associated with the change in netlist in a control store word of a corresponding emulation step; and dynamically apply offsets to one or more read addresses of control store words based upon modifying the keeptag.

BRIEF DESCRIPTION OF THE DRAWINGS

The accompanying drawings constitute a part of this specification and illustrate an embodiment of the subject matter described herein.

DETAILED DESCRIPTION

Embodiments disclosed herein describe systems and methods of data array compaction in an emulation system. Data array compaction is desired to utilize standard single-read single-write memory as a shared data array among emulation processors of a processor cluster (e.g., a P8 cluster containing 8 emulation processors) in an emulation system. Because memory used for the shared data array is single read-read and single-write, each of the read ports in each of the emulation processors in a cluster may have to be provided its own copy of the memory. Majority of data written to each copy of the memory may be useless data and may not be read in subsequent emulation steps. Systems and methods of data array compaction are therefore desired.

During compile time, a compiler may add keeptags (also referred to as keeptag bits within keeptag fields) to control store words for corresponding emulation steps. When a processor cluster (e.g., a P8 cluster) generates output bits during an emulation step, a compactor hardware may extract the keeptag bits from keeptag fields of the control store word for the emulation step and utilize the keeptag bits for compaction of the output bits. The keeptag bits may be associated with one or more read ports of an emulation processor and may indicate whether the read ports will read portions of the outputs during subsequent emulation steps. Accordingly, the compactor hardware may write to the data array the output bits that may be subsequently read in the later emulation cycles. The compactor hardware may further translate the logical addresses of the uncompacted data bits to the physical address of the compacted data bits in the data array in order to write data.

A dynamic modification engine may enable the functionality of dynamic netlist modification while supporting data array compaction. Upon receiving a dynamic netlist modification request, the dynamic modification engine may assert or de-assert one or more keeptag bits of a control store word. The dynamic modification engine may then initialize a pointer and traverse through all the control store words incrementing read addresses by the number of the keeptag bits that have been asserted when the read address corresponds to an address which is affected the keeptag modification. Alternatively, the dynamic modification engine traverse through all the control store words decrementing read addresses by the number of keeptag bits that have been de-asserted. Once the pointer reaches the last control store word, the dynamic modification engine may take in the next request in the request queue. The dynamic modification engine may be executed by a dynamic modification circuit that may interface with a cluster of emulation processors, e.g., a P64 cluster with 64 emulation processors.

Figure 1:
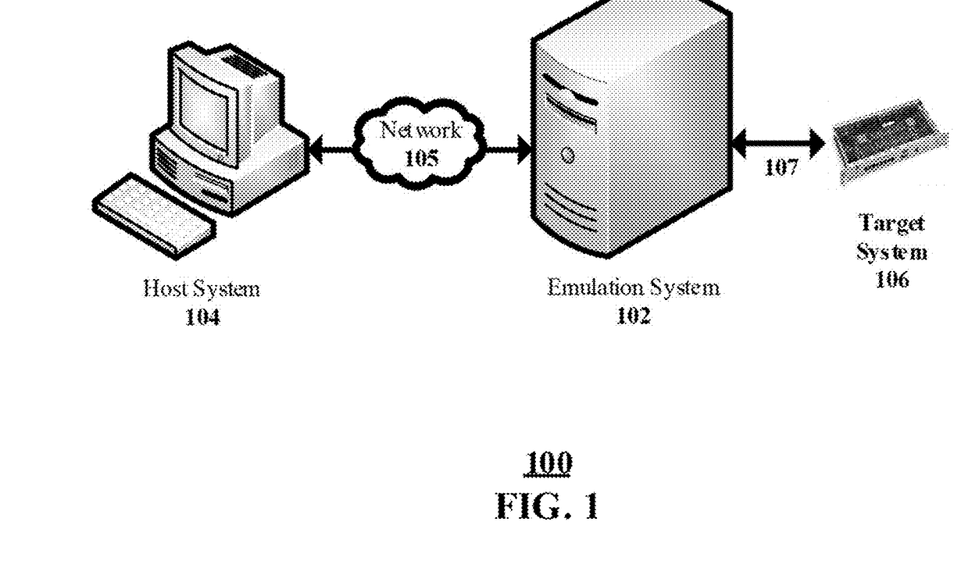
FIG. 1 shows an illustrative environment including an emulation system, according to an embodiment.

FIG. 1 shows an illustrative environment 100 of an emulation system, according to an embodiment. The illustrative environment 100 may comprise a host system 104, an emulation system 102, a target system 106, a network 105, and a connection 107. The host system 104 may include one or more workstations that may run debug and runtime software interacting with the emulation system 102. The workstations may be any type of computing devices such as a desktop computers, laptop computers, tablet computers, and smartphones. The emulation system 102 may a combination of hardware and software modules which may emulate a design under test (DUT). The emulation system 102 may include clusters (different from processor clusters) of interconnected ASICs (or chips), non-transitory memory devices, buffers, data storage devices configured to provide a system platform for emulating the DUT. The clusters may be arranged in multiple boards. The boards may be arranged within multiple racks. Multiple racks may be arranged in a plurality of emulation of devices, which may be analogous to multi-rack servers. The target system 106 may comprise hardware and/or software modules configured to interact with the DUT being emulated. For example, if the DUT is a design of a graphics processing unit (GPU), the target system 106 may be a motherboard configured to receive the GPU after fabrication. The target system 106 may be an external hardware environment provided by the user.

The network 105 may be any kind of communication link facilitating communication between the host system 104 and the emulation system 102. For example, the network 105 may a local area network may include a local area network (LAN), metropolitan area network (MAN), wide area network (WAN), and/or the Internet. The connection 107 may be also be any kind of communication link configured to facilitate a communication with the emulation system 102 and the target system 106.

The above described systems 102, 104, 106 of the environment 100 are merely illustrative and other configuration should be considered to be within the scope of this disclosure. For example, the network 105 may include a local connection 107 or a combination of multiple local interconnects. In some embodiments, the systems 102, 104, 106 may be local and housed within the same building. In other embodiments, one or more of the systems 102, 104, 106 may be accessed remotely. For example, the host system 104 may remotely access the emulation system 102 through the network 104 using a remote access protocol such as internet protocol (IP).

Figure 2:
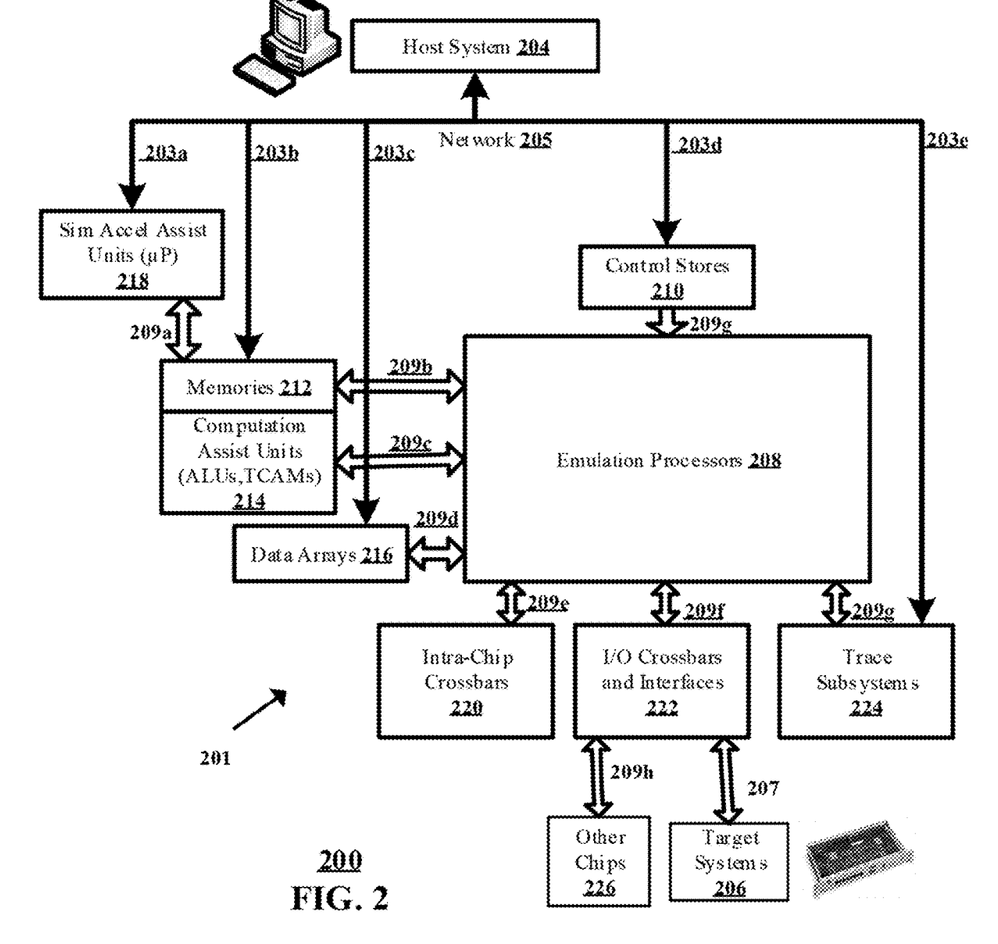
FIG. 2 shows an illustrative emulation chip, according to an embodiment.

FIG. 2 shows a more detailed view of the illustrative environment 200, particularly showing the components within an ASIC 201 of an emulation system (such as the emulation system 102 in FIG. 1). As shown, the ASIC 201 may comprise emulation processors 208 (which may be arranged as processor clusters), control stores 210, memories 212, computation assist units 214, data arrays 216, simulation acceleration assist units 218, intra-chip crossbar 220, input/output crossbars and interfaces 222, and trace subsystems 224. As shown, these components may be connected using the interconnects 209a-209h. Furthermore, a network 205 (similar to the network 105 in FIG. 1) connecting the host system 204 (similar to the host system 104 in FIG. 1) with the ASIC 201 may include interconnects 203a-203e.

Each ASIC in the emulation system may contain a large number of emulation processors 208 (also referred to as Boolean processors). The emulation processors 208 may retrieve a program containing instructions from the control store 210 and execute the program for one or more emulation cycles. For a DUT, the program may be the same for different emulation cycles, and the data on which the program operates may change because of the change in the states of the DUT from one cycle to another. These states, representing the state of the DUT's state elements, intermediate combinational nodes, and states of design memories are stored by a cluster of emulation processors 208 (typically a cluster of 8 emulation processors 208) into data arrays 216. In some embodiment, the cluster of emulation processors 208 may store the states into other larger memories 212 that may comprise internal memory (INTRAM) and external memory (EXTRAM).

The ASIC 201 may further comprise computation assist units 214 that the ASIC 201 may use to model functions that may not be efficiently handled by general-purpose bitwise processors and generic memories. The computation assist units 214 may include hardware structures to perform arithmetic operations (ALUs) and to emulate ternary content-addressable memories (TCAMs). The ASIC 201 may also comprise simulation acceleration assistance units 218, which may be embedded microprocessors that may provide a capability for local processing of simulation acceleration or analysis tasks. The local processing of simulation acceleration unit may be implemented along with any other simulation acceleration at the host workstation 204.

The intra-chip crossbars 202 may provide an interface for the emulation processors 208 to interact with the other processors in other ASICs (not shown). The input/output (I/O) crossbars and interfaces 222 may provide an interface for the ASIC 201 to interact with the target systems 206 (similar to the target system 106 in FIG. 1) or other external chips 226. The target systems 206 and the external chips 226 may provide an external hardware environment for the DUT being emulated by the emulation system. The target systems 206 may be connected to the ASIC 201 using a connection 207 (similar to the connection 107 in FIG. 1). The trace subsystems 224 may collect and/or store signals generated in the ASIC 201 (or the emulation system in general) during the execution of the DUT. The trace subsystems 224 may function in concert with compiler and runtime or offline debug code to collect and store the signals. The trace subsystems 224 may support two general modes of operations: (i) dynamic probes, which may allow a set of user-specified probes with deep traces and (ii) full vision, which may allow reconstruction of all user signals without user specification and without performance impact.

Figure 3:
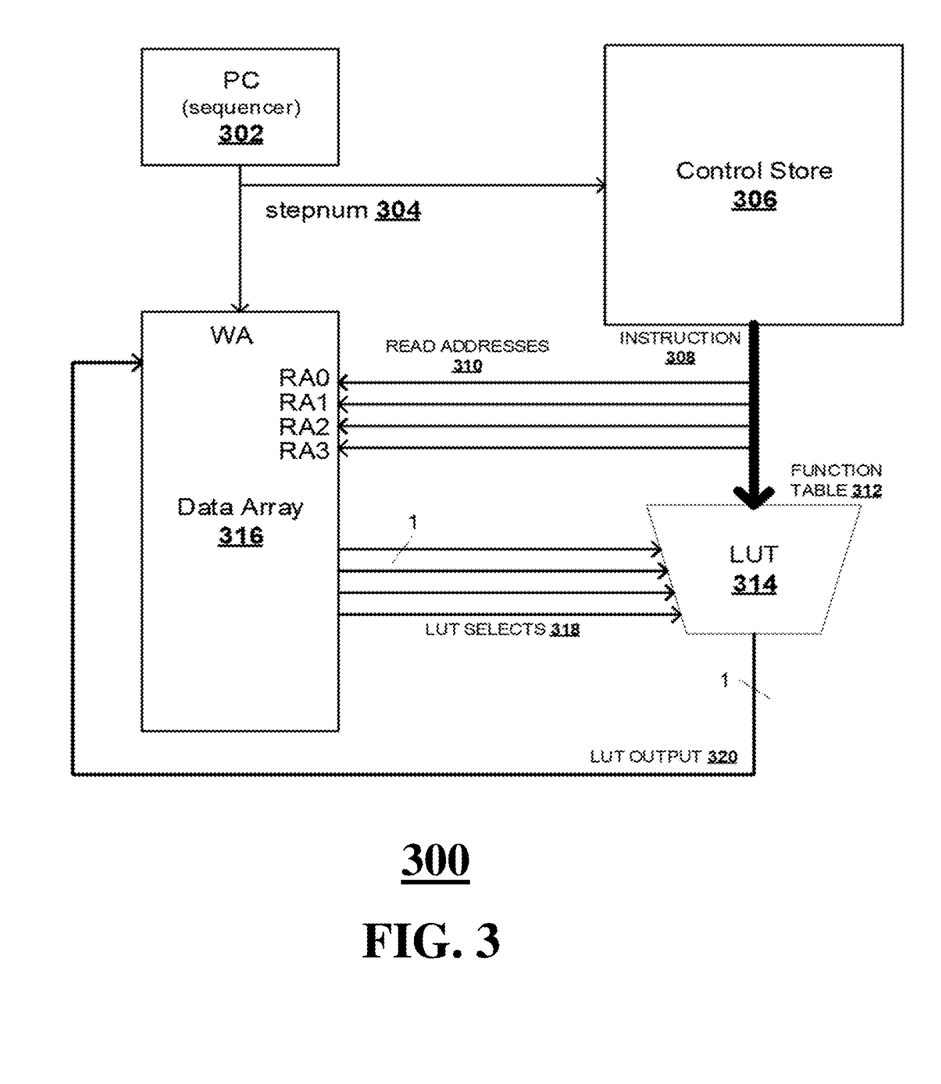
FIG. 3 shows an illustrative emulation processor architecture, according to an embodiment.

FIG. 3 shows an illustrative emulation processor architecture 300, according to an embodiment. The emulation processor architecture 300 may include a program counter (or sequencer) 302 providing a step number (stepnum) signal 304 to a control store 306. The stepnum signal 304 may contain an address of an instruction 308 (also referred to as a control store word) in the control store 306. While emulating a DUT, the program counter 302 may sequentially provide the stepnum signal 304 such that the control store 306 outputs an instruction 308 corresponding to the address in the stepnum signal 304. The instruction 308 may have a plurality of read addresses 310 provided to a data array 316. As shown, the instruction 308 may have four read addresses RA0, RA1, RA2, and RA3 provided to the read ports of the data array 316. In response, the data array 316 may output corresponding lookup table (LUT) select signals 318 corresponding to the read addresses. For the embodiment containing the four read addresses RA0, RA1, RA2, RA3, the data array 316 may provide four LUT select signals 318. For a single emulation processor, each of the LUT select signals 318 may be a single bit. It should be understood that the read ports of the data array 316 may have corresponding read ports in an emulation processor associated with the emulation processor architecture 300.

The instruction 308 may further include a function table (FTAB) field 312 that may specify the computation to be performed by a LUT 314 on the LUT select signals 318. Based on the computation specified by the function table field 312 on the LUT select signals 318, the LUT 314 may generate a LUT output 312 that may be written back to the data array 316 at a write address WA specified by the program counter 302.

Standard cell-based memory supports a single-read and a single-read per emulation cycle. Therefore, to support four reads for the four read addresses 310, the data array 316 may have to maintain four copies of the same data. Therefore, for a P8 cluster containing 8 emulation processors where each emulation processor has four read ports, the data array 316 may have 32 copies of the same data, if un-compacted. Embodiments disclosed herein describing compacting data generated each emulation cycle based upon keeptag bits associated with one or more ports of each of the emulation processors therefore having a shallower memory with a lower power consumption.

Figure 4:
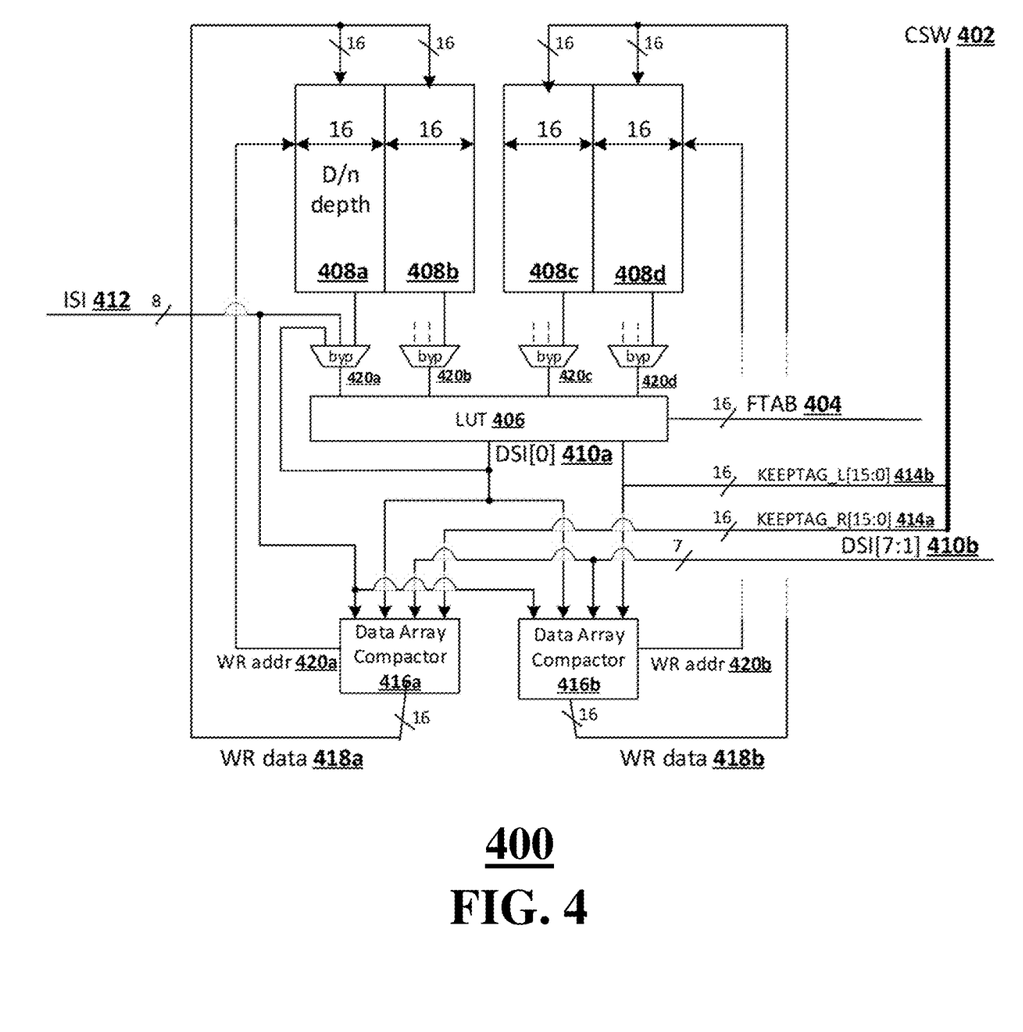
FIG. 4 shows an illustrative data array compactor circuit, according to an embodiment.

FIG. 4 shows an illustrative emulation circuit 400 for data array compaction, according to an embodiment. The emulation circuit 400 for data array compaction (also referred to as compactor hardware) may include data array compactors 416a, 416b and keeptag fields 414a, 414b (that may include keeptags or keeptag bits) corresponding to the data array compactors 416a, 416b.

At an emulation step being executed by the emulation circuit 400, the emulation circuit 400 may receive a control store word 402 from a local control store (e.g., control store 306 shown in FIG. 3). The emulation circuit 400 may be in cluster of eight emulation processors (a P8 cluster) and the control store word 402 may be transmitted by a local control store word associated with the P8 cluster. An emulation phase may have 768 emulation steps and therefore the local control store may contain 768 control store words including the control store word 402. In the control store word 402, there may be a function table (FTAB) logic 404 that provides a computational instruction to a lookup table (LUT) 406. The LUT 406 may implement the Boolean processing functionality of one of the emulation processors (referred hereinafter as emulation processor 0) of the P8 cluster. As shown, the FTAB logic 404 for the LUT 406 of emulation processor 0 may include 16 bits from the control store word 402. Using the FTAB logic 404, the LUT 406 may perform a binary operation on four bits of data received from the corresponding portions 408a, 408b, 408c, 408d of a data array 408. It should be understood that the portions 408a, 408b, 408c, 408d may maintain corresponding bits for each of the four read ports of the data array 408 for the emulation processor 0. Therefore, for the P8 cluster, the data array 408 may have 32 portions with 4 read ports for each emulation processor in the P8 cluster.

Each of the portions 408a, 408b, 408c, 408d may be 16 bits long. Out of the 16 bits, 8 bits may be emulation processor outputs (DSI) of the P8 cluster, e.g., processor output DSI [0] 410a from the emulation processor 0 and DSI [7:1] from emulation processors 1-processor 7 (not shown) of the P8 cluster (collectively referred to as DSI [7:0] 410). The other 8 bits may be bits received from sources outside the P8 cluster, e.g., ISI 412. For example, the first 8 bits starting from the most significant bit may be the ISI 412 and the last 8 bits ending at the least significant bit may be DSI [7:0] 410.

As described above, this embodiment may include 768 steps in an emulation phase. Therefore, from each of the portions 408a, 408b, 408c, 408d of the data array 408 may receive 768 read requests and store 768 bits. With the width of 16 bits, each of the portions may be 768/16=48 lines. However, as described below, the depth of each of the portions of 408a, 408b, 408c, 408d the data array 408 because of the sharing of keeptag fields across a pair of read ports within an emulation processor.

The control store word 402 may further include keeptag fields 414a, 414b (collectively referred to as keeptag fields 414 and commonly referred to keeptag field 414). Each of the keeptag fields 414a, 414b may be associated with a pair of read ports of the data array 408 for the emulation processor 0. For example, keeptag field 414a may be associated with read port 0 and read port 1 of the data array 408 and used by the emulation processor 0 and keeptag field 414b may be associated with read port 2 and read port 3 of the data array 408 and used by the emulation processor 0. Because a pair of read ports may share keeptag, the depth of the data array 408 may have to be doubled to 96 lines. The keeptag fields 414 may include the corresponding keeptags (also referred to as keeptag bits).

In operation, emulation processor 0 may read a bit from each of the portions 408a, 408b, 408c, 408d of the data array 408 in a step within an emulation phase. The four read addresses (not shown) may be provided within the control store word 402. The four bits of data read from the data array 408 may be input to the LUT 406, which may use the FTAB field 404 to generate the output DSI[0] (indicating the output of emulation processor 0 at this step) 410a. Furthermore, the 7 other emulation processors may generate the outputs DSI [7:1] 410b in the current step. The outputs of the 7 other emulation processors may be: (1) DSI[1] from emulation processor 1, (2) DSI[2] from emulation processor 2, (3) DSI[3] from emulation processor 3, (4) DSI[4] from emulation processor 4, (5) DSI[5] from emulation processor 5, (6) DSI[6] from emulation processor 6, and (7) DSI[7] from emulation processor 7. Further the P8 cluster may receive ISI 412 from data sources external to the P8 cluster. A first data array compactor 416a may compact the received ISI 412 and the DSI 410 using the keeptags field 414a associated with read port 0 (corresponding to the portion 408a) and read port 1 (corresponding to portion 408b) of emulation processor 0. A second data array compactor 416b may compact the received ISI 412 and the DSI 410 using the keeptags field 414b associated with read port 2 (corresponding to the portion 408c) and read port 3 (corresponding to the portion 408d) of emulation processor 0. The first data array compactor 416a may store compacted data 418a at a write address 420a to the first portion 408a and the second portion 408b of the data array 408. The second data array compactor 416b may store compacted data 418b to at write address 420b to the third portion 408c and the fourth portion 408d of the data array 408. The data array compactors 416a, 416b may collect the bits indicated by the keeptags and determine the write address and write data by forming a write to the data arrays 408 whenever there is a full line of bits (16 bits in this illustration) and by incrementing the write address to be used for the subsequent store operation.

The illustrative emulation circuit 400 may further provide a bypass functionality such that emulation processors in the cluster may access the result of the most recent calculations without the latency of writing the data into and reading data out of the data array 408. As shown, the output of emulation processor 0, DSI [0] 410a may be fed back to LUT 406 (the computation portion of emulation processor 0) using a bypass multiplexer 420a without being written into the data array 408a. The bypass multiplexer 420a may bypass DSI [0] 410a as a first selector to the LUT 406. Furthermore bypass multiplexers 420b, 420c, 420d may bypass DSI [0] 410 as second, third, and fourth selectors to the LUT 406. Alternatively, a read logic in the data array 408 may compensate for the delay in writing to the data array 408 by observing the write data (e.g., compacted data 418) and write address 420 before a complete line has been collected. In this case, those signals represent a pending partial write and can be decoded and provided as the input to LUT 406, when the desired read address compares to the partial write address and data.

The illustrative emulation circuit 400 may use a timer function to implement the bypass functionality. For instance, each of the data array compactors 416a, 416b may accumulate data until there are 16 bits of compacted data to write to the data array 408. Because of the arbitrary nature of the keeptags fields 414a, 414b, the data may be held at the data array compactors 416a, 416b for an arbitrary amount of time and the bypass may have to be arbitrarily deep. However, using the timer function, the data array compactors 416a, 416b may write partial data back to the data array 408 after the expiry of a timer thereby bounding the depth of the bypass functionality. Therefore, data stored at the data array 408 at addresses before the expiry of the current timer may be old (e.g., the data array compactors 416a, 416b may be holding new data waiting for the timer to expire), and if the scheduler wants new data, it may have to use the bypass functionality. However, data stored at the data array 408 at addresses after the expiry of the current timer may be new because the data array compactors 416a, 416b may have written the their data to the data array 408 as the current timer has expired.

The illustrative emulation circuit 400 may provide a functionality of data array compaction after stoppage. To that end, the illustrative emulation circuit 400 may maintain an uncompacted data array (not shown). If the emulation steps have been stopped and are resuming, the emulation circuit may run the data compaction logic for the data stored in the uncompacted data array, e.g., feed the data stored in the uncompacted data array through the data array compactors 416a, 416b. Therefore, the uncompacted data is stored in a compacted form in the data array 408 after the resumption of the emulation steps.

Figure 5:
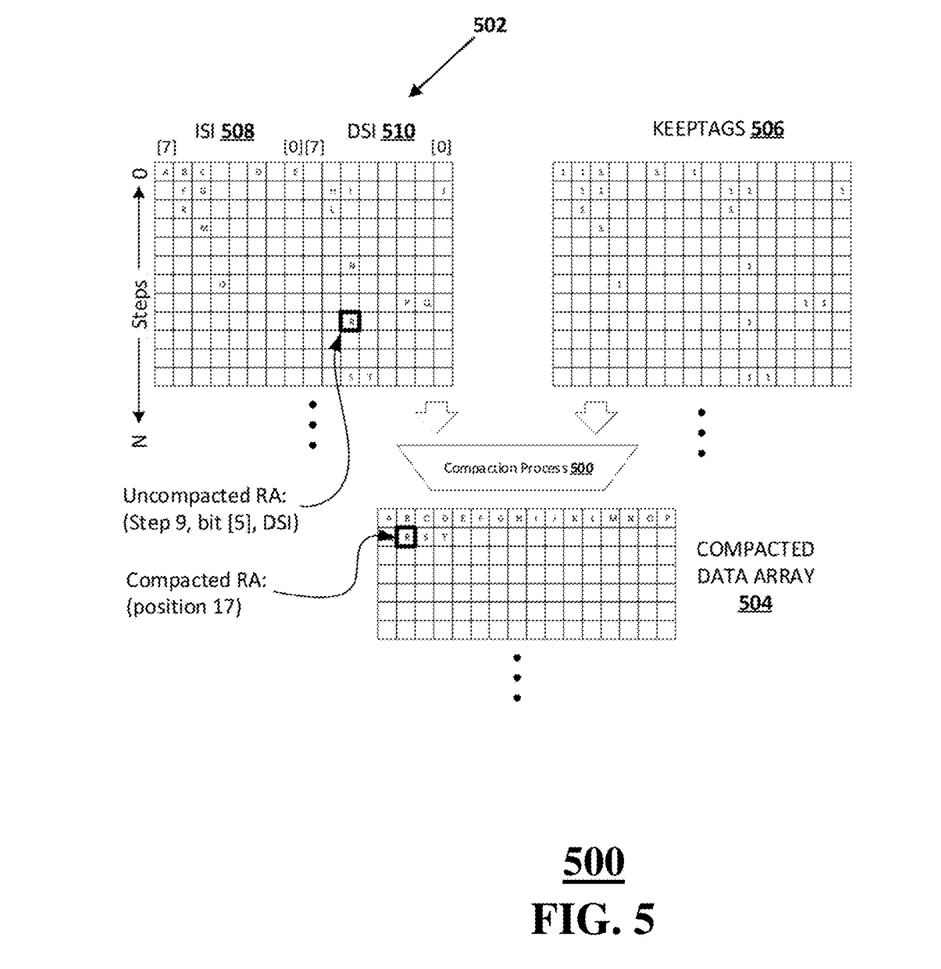
FIG. 5 shows an illustrative process of data array compaction, according to an embodiment.

FIG. 5 shows an illustrative data array compaction process 500, according to an embodiment. The compaction process 500 may generate a compacted data array 504 from a non-compacted data 502 using keeptags 506.

The non-compacted data 502 may be generated within a P8 cluster across multiple steps (as shown, steps 0 to N). During each step, the P8 processor cluster may generate 8 bits of DSI 510 with each of 8 processor generating a single bit. Furthermore, the P8 cluster may receive 8 bits of ISI 508 from sources outside the P8 cluster. In the non-compacted data 502, each row may be arranged as ISI [7:0] 508 and DSI [7:0] 510. The keeptags 506 may be associated with a pair of read ports of a processor in the P8 cluster.

The compaction process 500 may store the data if the corresponding keeptags bits are asserted. The association between the non-compacted data 502 and the keeptags array 506 may be as follows:

KEEPTAG [15:0] ⇔ {ISI [7:0], DSI [7:0] }
(step0, DSI [0]), (step0, DSI [1]), . . . , (step0, DSI [7]),
(step0, ISI [0]), (step0, ISI [1]), . . . , (step0, ISI [7]),
(step1, DSI [0]), (step1, DSI [1]), . . . , (step1, DSI [7]),
. . .
(stepN, ISI [0]), (stepN, ISI [1]), . . . , (stepN, ISI [7])

Therefore, based on the keeptag bits 506, the compaction process 500 may store data bits A, B, C, D, E, F, G, H, I, J, K, L, M, N, O, P, Q, R, S, and T from the uncompacted data 502 to the compacted data array 504. The compaction process 500 may discard other data bits.

The compaction process 500 may further calculate physical read addresses for the compacted data array 504. For example, a logical read address for uncompacted data bit R may be step 9, bit [5], DSI. Because, the data is compacted dropping bits identified by de-asserted keeptags, the logical address may no longer be valid in the compacted data array 504. Therefore the compaction process 500 may calculate the physical read address in the compacted data array 504. To calculate the physical addresses of the data bits in the compacted data array 504, the compaction process 500 may, for emulation steps 0-N may traverse through all the keeptags 506. If the keeptag is set (or asserted), the compaction process 500 may increment the physical address by 1. Therefore starting from physical address 0 for the data bit corresponding to the first asserted keeptag of the emulation steps 0-N, the compaction process 500 may generate contiguous physical addresses for each data bit corresponding to each of the successive asserted keeptag. Therefore, the physical read address for the data bit R may be position 17, occurring after position 0-16. TABLE I shows a pseudocode for calculating physical read addresses.

TABLE I

Pseudo-code for calculating physical read addresses

```
ra=0
for s in [0..N]:
    for XSI in (DSI, ISI):
        for i in [0..7]:
            if (KEEPTAG for (step s, XSI[i]) is set) {
                RA value for CSW = ra;
                ra++;
            }
```

Figure 6:
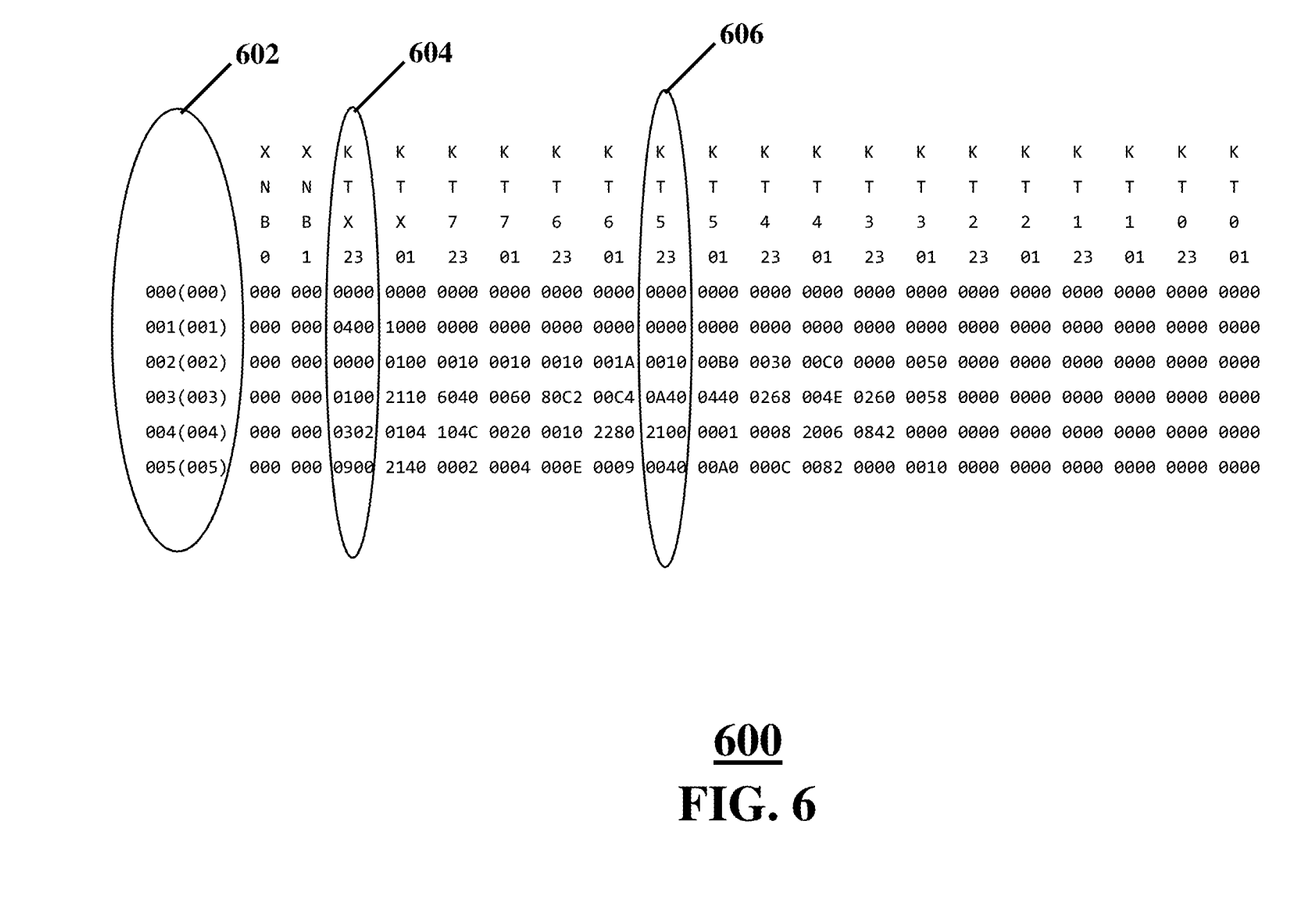
FIG. 6 shows an illustrative keeptags file, according to an embodiment.

FIG. 6 shows an illustrative file 600 containing keeptag fields (containing keeptags or keeptag bits), according to an embodiment. In the filed 600, the keeptag fields may be associated with the emulation steps 602. As shown, there are 6 emulation steps 602: (1) Step 0, (2) Step 1, (3) Step 2, (4) Step 3, (5) Step 4, and (6) Step 5. The keeptag fields may be associated with read ports of each emulation processor in a P8 cluster containing 8 emulation processors.

For example, the keeptag fields 606 may be associated with read ports 2 and 3 of emulation processor 5 of a cluster in a 16-bit binary format are as follows:

| | |
|---|---|
| Step 0: 0000 0000 0000 0000 | [0x 0000] |
| Step 1: 0000 0000 0000 0000 | [0x 0000] |
| Step 2: 0000 0000 0001 0000 | [0x 0010] |
| Step 3: 0000 1010 0100 0000 | [0x 0A40] |
| Step 4: 0010 0001 0000 0000 | [0x 2100] |
| Step 5: 0000 0000 0100 0000 | [0x 0040] |

As shown, each of the keeptag fields 606 may be associated with ISI [7:0] and DSI [7:0]. For example, the asserted bit in the step 2 corresponds to DSI [4].

Therefore, the data stored in a shared data array of the P8 cluster for the read ports 2 and 3 of processor 5 may be:
Position 0: (step2, DSI [4]), Position 1: (step3, DSI [6])
Position 2: (step3, ISI [1]), Position 3: (step3, ISI [3])
Position 4: (step4, ISI [0]), Position 5: (step4, ISI [5])
Position 6: (step5, DSI [6])

The P8 cluster may further include 4 additional data array ports and the file 600 may contain keeptag fields 606 for port 2 and port 3 of the 4 additional data array ports. The keeptag fields 606 in a 16-bit binary format may be as follows:

| | |
|---|---|
| Step 0: 0000 0000 0000 0000 | [0x 0000] |
| Step 1: 0000 0100 0000 0000 | [0x 0400] |
| Step 2: 0000 0000 0000 0000 | [0x 0000] |
| Step 3: 0000 0001 0000 0000 | [0x 0100] |
| Step 4: 0000 0011 0000 0010 | [0x 0302] |
| Step 5: 0000 1001 0000 0000 | [0x 0900] |

Therefore the data stored in the compacted data array for the port 2 and port 3 of the additional data array ports may include:
Position 0: (step1, ISI [2]), Position 1: (step3, ISI [0])
Position 2: (step4, DSI [1]), Position 3: (step4, ISI [0])
Position 4: (step4, ISI [1]), Position 5: (step5, ISI [0])
Position 6: (step5, DSI [3])

Figure 7:
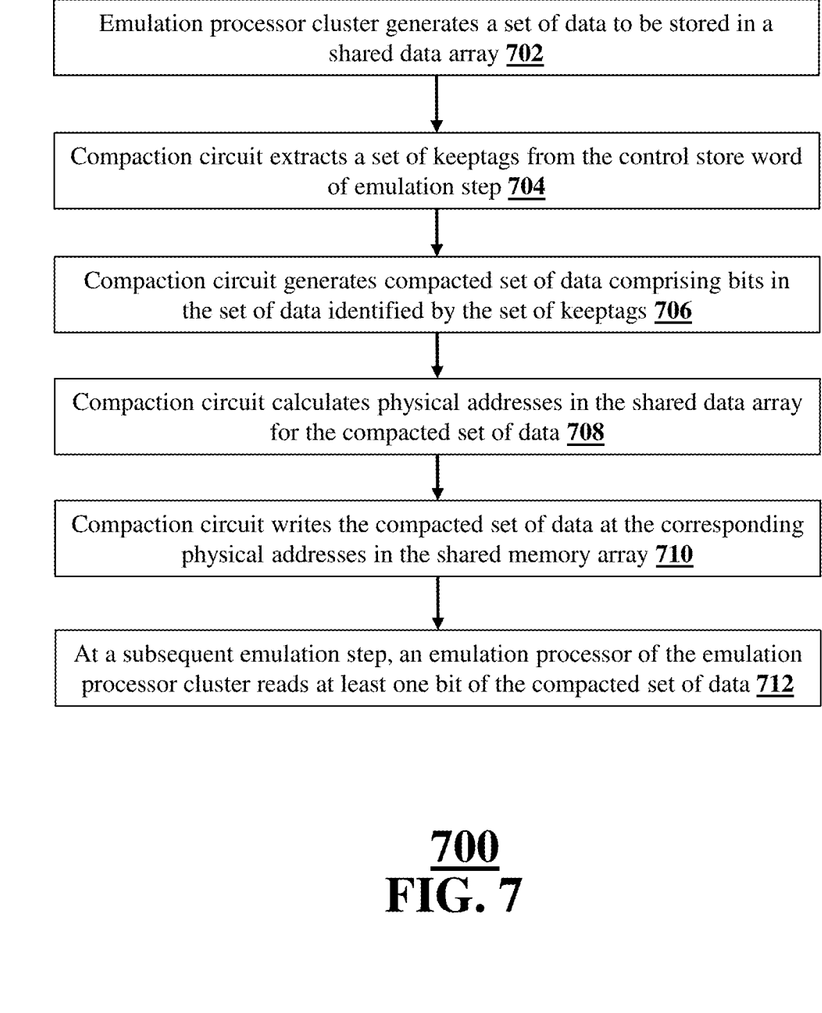
FIG. 7 shows a flow diagram of an illustrative method of data array compaction, according to an embodiment.

FIG. 7 shows a flow diagram of an illustrative method 700 of data array compaction, according to an embodiment. It should be understood that the steps described below are merely illustrative and additional, alternative, and lesser number of steps should be considered to be within the scope of this disclosure.

The method 700 may begin at step 702, where an emulation processor cluster may generate a set of data to be stored in a shared data array. For example, the emulation processor cluster may be a P8 cluster containing 8 emulation processors all having read/write access to the shared data array. The set of data may include DSI bits generated locally within the P8 cluster and ISI bits received from outside the P8 cluster. Therefore, the set of data may include 16 bits with 8 ISI bits and 8 DSI bits.

At step 704, a compaction circuit may extract a set of keeptags from a control store word of the current emulation step. The compaction circuit may be associated with an emulation processor within the P8 cluster and may generate separate compacted subset of data for each of the 4 read ports of the emulation processor. In some embodiments, each of the 2 pairs of read ports of the emulation processors may share keeptags and therefore the compaction circuit may generate two subsets of compacted data for corresponding pairs of read ports. Sharing of the keeptags between a pair of ports in the emulation processor may result in a smaller number of keeptag bits in the control store words. For example, the number of keeptag bits for each pair of read ports may be 16.

At step 706, the compaction circuit may generate a compacted set of data comprising bits in the set of data identified by the set of keeptags. As described above, the compaction circuit may generate two subsets of compacted data for each pair of read ports of an emulation processor. To generate a first subset of compacted data from a first pair of read ports (e.g., read port 0 and read port 1), the compaction logic may perform an AND operation with the 16 bits of set data and 16 bits of the corresponding keeptags. If keeptag is set or asserted (e.g., keeptag=1), the compaction circuit may keep the corresponding bit of the set of the data for writing into the shared data array. If the keptag is unset or de-asserted (e.g., keeptag=0), the compaction circuit may drop the corresponding bit of the set of data and not write into the shared data array. The compaction circuit may perform the similar operation to generate a second subset of compacted data for the second pair of read ports (e.g., read port 2 and read port 3) of the emulation processor. It should be understood that the association of keeptags to ports could be different, with one set of keeptags associated with each read port, or one set of keeptags for four read ports, or even all the read ports of more than one emulation processor. Sharing the keeptags between ports may reduce the total number of keeptag bits, but may require a larger compacted data arrays because each array will store data that it does not need to store.

At step 708, the compaction circuit may calculate physical addresses in the shared data array for the compacted set of data. For example, for a pair of read ports, the compaction circuit may initialize physical address as 0 and increment the physical address by 1 for each asserted keeptag.

At step 710, the compaction circuit may write the compacted set of data at the corresponding physical addresses in the shared memory array. For an emulation processor, the compaction circuit may perform 4 parallel or near parallel write operations each writing into separate memory associated with the 4 read ports of the emulation processor. However, as a pair of read port may share the keeptag bits, the compaction circuit may write the same compacted data to corresponding pairs of memory.

At step 712, an emulation processor of the emulation processor cluster may read at least one bit of compacted set of data. The reading of the at least one bit of the compacted set of data may occur at a subsequent emulation step.

Figure 8:
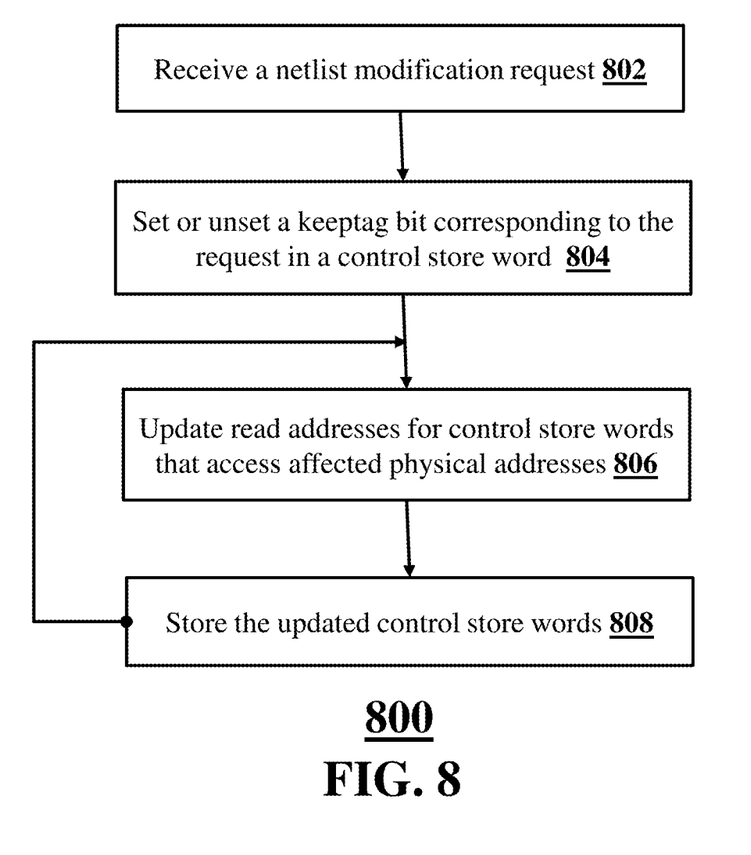
FIG. 8 shows a flow diagram of an illustrative method of dynamic netlist modification in an emulation system providing a compacted data array.

FIG. 8 shows a flow diagram of illustrative method 800 of dynamic netlist modifications of compacted data arrays, according to an embodiment. Although multiple components within the emulation system may implement various steps of the method 800, the following description describes a single dynamic modification engine implementing all steps of the method 800. It should be understood that the steps described below are merely illustrative and additional, alternative, and lesser number of steps should be considered to be within the scope of this disclosure. In some embodiments, the dynamic modification engine may comprise software/firmware modules executed by a dynamic modification circuit. The dynamic modification circuit may interface a P64 cluster of emulation processors containing 8 P8 clusters.

The method may begin at step 802, where the dynamic modification engine may receive a netlist modification request. For processing a plurality of netlist modification requests, the dynamic modification engine may enable a sequence of queued requests. The netlist modification request may comprise either (1) set a particular keeptag or (2) unset a particular keeptag in a control store word at a control store. It should be understood that setting a keeptag bit means to change the keeptag from 0 to 1 and unsetting a keeptag means to change the keeptag from 1 to 0. The keeptags that are set or unset may be associated with one or more read ports of the shared data array.

At step 804, the dynamic modification engine may set (also referred to as assert) or unset (also referred to as de-assert) a keeptag corresponding to the modification request in the respective control store word. The dynamic modification engine may set or unset the keeptag bit during a gap cycle. In the gap cycle, the emulation system may not be performing emulation operations. The gap cycle may include 8 emulation steps within the P64 cluster and its constituent P8 clusters because one cycle of the system clock of the emulation system may correspond to eight cycles of one or more local clocks driving the P64 cluster.

At step 806, the dynamic modification engine may update read addresses for control store words that may access physical addresses based on the modification of the keeptag (e.g., being set or unset) at step 804. The dynamic modification engine may update read addresses of affected control store words. e.g., physical read address field points in the control store words subsequent to the physical read address associated with the keeptag that has been modified. If the dynamic modification engine has set the keeptag at step 804, the affected read addresses may have to incremented by 1 to account for a new data bit stored in the shared memory array. On the other hand, if the dynamic modification engine has unset the keeptag at step 804, the affected read addresses may have to decremented by 1 to account for a data bit that will not be stored in the shared memory array.

For modifying the affected control words, the dynamic modification engine may set an update pointer update_ptr initially to 0. The update_ptr may represent the address (stepnum) of a first control store word of which read address has not yet been modified. For the update, the dynamic modification engine may read a control store word at the location of the update_ptr, e.g., update_ptr=0 may indicate the first control store word. In the read control store word, the dynamic modification engine may modify one or more read addresses based on how the keeptag was modified in step 804. As described above, if the keeptag was set, the dynamic modification engine may increment each of the read addresses by 1. If the keeptag was unset, the dynamic modification engine may decrement each of the read addresses by 1.

At step 808, the dynamic modification engine may store the updated control store words. The dynamic modification engine may then increment the update_ptr and update read addresses in the next control store word by executing steps 806 and 808. The dynamic modification engine may iteratively execute (e.g., loop) steps 806 and 808 until read addresses in all the control store words have been modified. Furthermore, until the updates to the control store words are complete, the dynamic modification engine may have to adjust read addresses dynamically when affected but non-updated control store words are read for execution. Therefore, if the dynamic modification engine has not reached an affected control store word for update and storage, the dynamic modification engine may have to update read addresses in the control store word dynamically prior to executing the control store word.

The foregoing method descriptions and the process flow diagrams are provided merely as illustrative examples and are not intended to require or imply that the steps of the various embodiments must be performed in the order presented. The steps in the foregoing embodiments may be performed in any order. Words such as "then," "next," etc. are not intended to limit the order of the steps; these words are simply used to guide the reader through the description of the methods. Although process flow diagrams may describe the operations as a sequential process, many of the operations can be performed in parallel or concurrently. In addition, the order of the operations may be re-arranged. A process may correspond to a method, a function, a procedure, a subroutine, a subprogram, and the like. When a process corresponds to a function, the process termination may correspond to a return of the function to a calling function or a main function.

The various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of this disclosure or the claims.

Embodiments implemented in computer software may be implemented in software, firmware, middleware, microcode, hardware description languages, or any combination thereof. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The actual software code or specialized control hardware used to implement these systems and methods is not limiting of the claimed features or this disclosure. Thus, the operation and behavior of the systems and methods were described without reference to the specific software code being understood that software and control hardware can be designed to implement the systems and methods based on the description herein.

When implemented in software, the functions may be stored as one or more instructions or code on a non-transitory computer-readable or processor-readable storage medium. The steps of a method or algorithm disclosed herein may be embodied in a processor-executable software module, which may reside on a computer-readable or processor-readable storage medium. A non-transitory computer-readable or processor-readable media includes both computer storage media and tangible storage media that facilitate transfer of a computer program from one place to another. A non-transitory processor-readable storage media may be any available media that may be accessed by a computer. By way of example, and not limitation, such non-transitory processor-readable media may comprise RAM, ROM, EEPROM, CD-ROM or other optical disk storage, magnetic disk storage or other magnetic storage devices, or any other tangible storage medium that may be used to store desired program code in the form of instructions or data structures and that may be accessed by a computer or processor. Disk and disc, as used herein, include compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and/or instructions on a non-transitory processor-readable medium and/or computer-readable medium, which may be incorporated into a computer program product.

The preceding description of the disclosed embodiments is provided to enable any person skilled in the art to make or use the embodiments described herein and variations thereof. Various modifications to these embodiments will be readily apparent to those skilled in the art, and the generic principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. An emulation method comprising:
   receiving, by a dynamic modification engine in a logic emulator, a request to dynamically change a netlist associated with a logic being emulated;
   modifying, by the dynamic modification engine, a keeptag associated with the change in netlist in a control store word of a corresponding emulation step; and
   dynamically applying, by the dynamic modification engine, offsets to one or more affected read addresses of control store words based upon modifying the keeptag.

2. The method according to claim 1, wherein modifying the keeptag comprises:
   asserting, by the dynamic modification engine, the keeptag that is de-asserted.

3. The method according to claim 2, wherein dynamically applying offsets to one or more affected read addresses of control store words comprises:
   incrementing, by the dynamic modification engine, each of the one or more affected read addresses by 1.

4. The method according to claim 1, wherein modifying the keeptag comprises:
   de-asserting, by the dynamic modification engine, the keeptag that is asserted.

5. The method according to claim 4, wherein dynamically applying offsets to one or more affected read addresses of control store words comprises:
   decrementing, by the dynamic modification engine, each of the one or more affected read addresses by 1.

6. The method according to claim 1, further comprising:
   queuing, by the dynamic modification engine, a plurality of requests including the request.

7. The method according to claim 1, wherein dynamically applying offsets to one or more affected read addresses of control store words comprises:
   initializing, by the dynamic modification engine, a pointer at a location of control store word that has not been modified;
   offsetting, by the dynamic modification engine, read addresses in the control store word at the location of the pointer; and
   incrementing, by the dynamic modification engine, the pointer to a next location.

8. The method according to claim 1, wherein the dynamic modification engine is associated with a cluster of 64 emulation processors.

9. The method according to claim 1, wherein the control store words are stored in a control store associated with a cluster of 8 emulation processors.

10. The method according to claim 9, wherein the control store contains 768 control store words.

11. A logic emulator comprising:
    a dynamic modification circuit configured to:
    receive a request to dynamically change a netlist associated with a logic being emulated;
    modify a keeptag associated with the change in netlist in a control store word of a corresponding emulation step; and
    dynamically apply offsets to one or more read addresses of control store words based upon modifying the keeptag.

12. The logic emulator to claim 11, wherein to modify the keeptag comprises, the dynamic modification circuit is further configured to:
assert the keeptag that is de-asserted.

13. The logic emulator according to claim 12, wherein to dynamically apply offsets to one or more read addresses of control store words, the dynamic modification circuit is further configured to:
increment each of the one or more read addresses by 1.

14. The logic emulator according to claim 11, wherein to modify the keeptag, the dynamic modification circuit is further configured to:
de-assert the keeptag that is asserted.

15. The logic emulator according to claim 14, wherein to dynamically apply offsets to one or more read addresses of control store words, the dynamic modification circuit is further configured to:
decrement each of the one or more read addresses by 1.

16. The logic emulator according to claim 11, wherein the dynamic modification circuit is further configured to:
queue a plurality of requests including the request.

17. The logic emulator according to claim 11, wherein to dynamically apply offsets to one or more read addresses of control store words, the dynamic modification circuit is further configured to:
initialize a pointer at a location of control store word that has not been modified;
offset read addresses in the control store word at the location of the pointer; and
increment the pointer to a next location.

18. The logic emulator according to claim 11, wherein the dynamic modification circuit is associated with a cluster of 64 emulation processors.

19. The logic emulator according to claim 11, wherein the control store words are stored in a control store associated with a cluster of 8 emulation processors.

20. The logic emulator according to claim 19, wherein the control store contains 768 control store words.

* * * * *